United States Patent [19]

Kim

[11] 4,342,045

[45] Jul. 27, 1982

[54] INPUT PROTECTION DEVICE FOR INTEGRATED CIRCUITS

[75] Inventor: Kyoung Kim, San Jose, Calif.

[73] Assignee: Advanced Micro Devices, Inc., Sunnyvale, Calif.

[21] Appl. No.: 144,472

[22] Filed: Apr. 28, 1980

[51] Int. Cl.³ ............................................. H01L 27/04
[52] U.S. Cl. ........................................ 357/41; 357/13; 357/20; 357/23; 357/51; 357/68
[58] Field of Search ....................... 357/20, 13, 41, 42, 357/68, 51, 23 R

[56] References Cited

U.S. PATENT DOCUMENTS

| | | | |
|---|---|---|---|
| 3,629,782 | 12/1971 | Sahni | 357/51 |
| 3,648,129 | 3/1972 | Nienhuis | 357/13 |
| 3,673,427 | 6/1972 | McCoy et al. | 357/13 |
| 3,673,428 | 6/1972 | Athanas | 357/42 |
| 3,712,995 | 1/1973 | Steudel | 357/42 |
| 3,754,171 | 8/1973 | Anzai et al. | 357/13 |
| 3,967,295 | 6/1976 | Stewart | 357/51 |
| 4,173,022 | 10/1979 | Dingwall | 357/23 |

OTHER PUBLICATIONS

Cohen et al., "Single-Transistor Cell . . . ", Electronics, Aug. 2, 1971, pp. 69-75 and front cover of issue.

*Primary Examiner*—William D. Larkins
*Attorney, Agent, or Firm*—Gary T. Aka; J. Ronald Richbourg

[57] ABSTRACT

A new input protection device for integrated circuits in which the metal-semiconductor contact between a metal line from a metal input pad and doped semiconductor region in the substrate leading to the rest of the integrated circuit is significantly rounded. This reduces the tendency of high current densities to flow through specific areas of the contact creating a short-circuiting metal-semiconductor spike into the substrate. Furthermore, the contact is enlarged beyond the normal size of contacts within the integrated circuit and the conducting region below is formed deeper and laterally away from the contact for further protection.

12 Claims, 9 Drawing Figures

INPUT PROTECTION DEVICE FOR INTEGRATED CIRCUITS

BACKGROUND OF THE INVENTION

1. Field of the Invention

This invention is related to the field of integrated circuit devices and, more particularly, to protection devices of inputs to integrated circuits.

2. Prior Art

In the design of integrated circuit devices, attention has been directed to the protection of the device component inputs disposed for receiving signals from the external world. Compared to the other connections, such as outputs and the ground line, which communicate with the external world, integrated circuit inputs have very small capacitance. Problems arise when externally generated static charges, such as may occur during handling, are transferred to the inputs of the device. Due to the small capacitances in the integrated circuit, these charges can create high voltages in the integrated circuit and wreak havoc among its elements. For example, in MOS integrated circuits the gate of the first MOS transistor receiving an input signal is protected. If not, errant charges can raise the voltage of the gate so high that an electric discharge occurs between the gate and the underlying semiconductor substrate, thereby burning out the gate oxide under the gate creating an incapacitating short circuit.

A standard integrated circuit device has metal contact pads which receive external lead wires joined to the pad by thermal compression or sonic bonding. The metal contact pad is connected to the rest of the integrated circuit by a doped conducting region in the substrate of opposite conductivity to the substrate. The conducting region forms a resistor and a P-N junction diode with the substrate, which in combination serve to release electrostatically generated charges into the substrate, thereby reducing the voltage at the input device for protection thereof.

In spite of this, it has been found that crippling short circuits can also occur at the contact area between the metal from a pad and the doped conducting region before an input device is broken down.

When electrostatic charges discharge through the conducting region, heat is generated which elevates temperatures to the eutectic point of the metal and semiconductor. A metal-semiconductor alloy spike is formed in the conducting region. If the alloy spike reaches the P-N junction boundary, the junction is permanently damaged and the device is rendered useless.

SUMMARY OF THE INVENTION

To overcome or substantially mitigate the above-described problems of the prior art an input protection device is provided for an integrated circuit on a semiconductor substrate of one conductivity type comprising at least one metal pad on the substrate for forming external electrical connections, the metal pad being connected to a conducting region of another conductivity type in the substrate by a metal-semiconductor contact, the contact having significantly rounded edges whereby the tendency to form higher local current densities through specific areas of the contact than through other areas of the contact is reduced.

Furthermore, in accordance with the invention it is preferable that the contact be larger than normal contacts and circular in shape. It is also preferable that the conducting region below the contact be formed deeper than the rest of the region and laterally away from the contact.

DETAILED DESCRIPTION

Figure 1A:
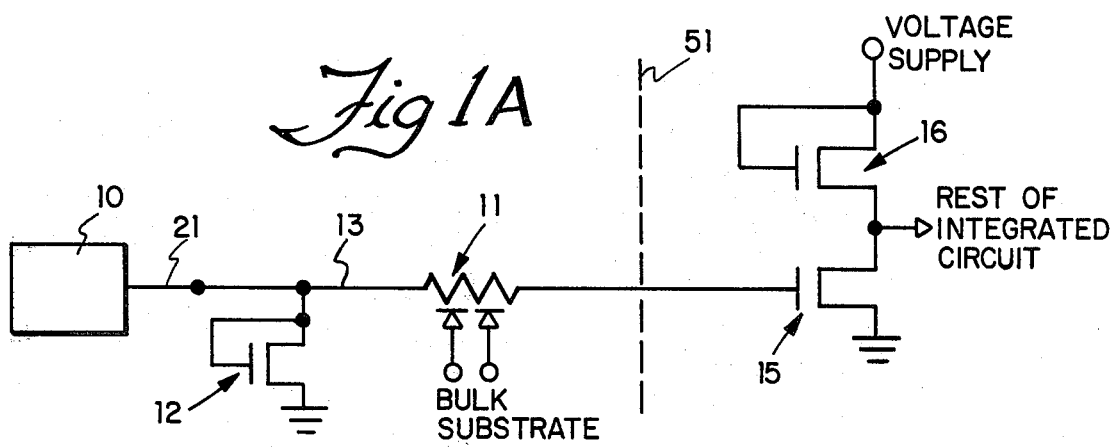
FIGS. 1A and 1B show ways in the prior art by which the gate of the input MOS device is protected.
Figure 1B:
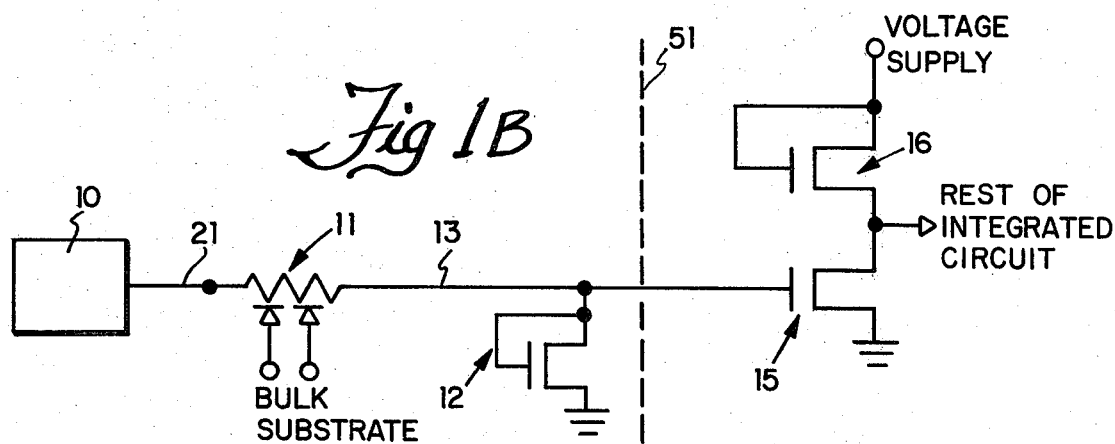

FIGS. 1A and 1B illustrate schematically some typical input protection devices used in MOS integrated circuit devices. These devices protect the input gate of an MOS transistor 15, which is part of an inverter circuit with a load transistor 16. The inverter circuit represents symbolically a circuit of the integrated circuit directly receiving input signals from the external world and the MOS transistor 15 represents the particular device receiving the signal. In these figures, the integrated circuit proper, which excludes the input protection circuit and contact pads of the device, is symbolically delineated as the region to the right of dotted line 51 in FIGS. 1A and 1B. When an errant charge of static electricity is introduced externally through a contact pad 10, an MOS transistor 12 and a resistor-diode 11 divert the charges away from the gate of transistor 15, avoiding an excessive increase in the voltage which can cause the gate oxide of transistor 15 to be burned out and rendered useless.

Structurally the contact pad 10 is metal, normally aluminum, formed on an insulating layer over a semiconductor, such as a silicon substrate which is the matrix for the integrated circuit. Metal is used for the contact pad 10 because it is best in retaining the lead wires used in connecting the contact pad 10 with the external world. The pad 10 is connected to the gate of transistor 15 through a metal line 21 and the resistor-diode 11. The resistor-diode 11 is formed simply by a conducting region of one conductivity type formed in the semiconductor substrate of another conductivity type by processes well-known in the art, such as masking and diffusion.

Figure 2A:
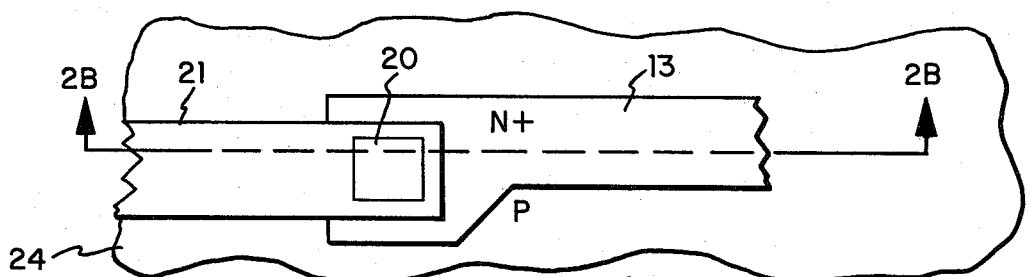
FIGS. 2A, 2B, and 2C, respectively show a planar, cross-sectional and perspective view of a contact to the conducting region in the substrate in the prior art.
Figure 2B:
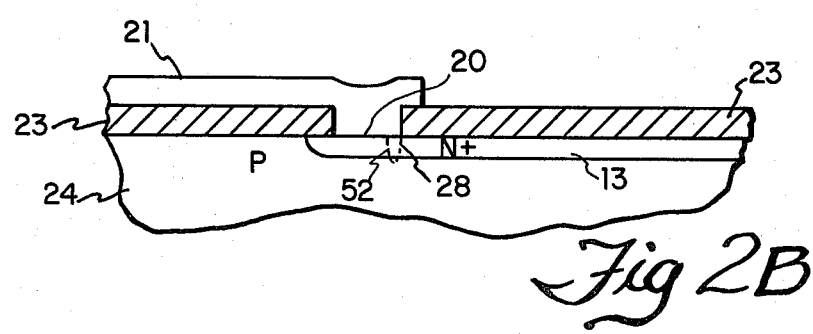

FIGS. 2A and 2B show such an N-type conducting region 13 in a P-type substrate 24. The conducting region 13, from its inherent structure is functionally a diffused resistor, a P-N junction diode and connecting line between the metal line 21 and the input transistor 15. This resistor-diode 11 plays an important role in input protection. The diode acts like a pressure relief valve in a system. When high voltage electrostatic charges arrive from the input pad 10, they are discharged through the P-N junction into the substrate 24 to lower the voltage at the input device, such as the transistor 15. The shallow conducting region adds resistance between the input pad 10 and the input transistor 15. The result of this resistance is to increase the RC time constant and slow the voltage rise time at the transistor 15 so as to allow more charge to escape through the P-N junction.

In addition to the resistor and diode, the MOS transistor 12 is employed as another means of input protection.

At a very high voltage far above a normal input level, the transistor is turned on to conduct away from the errant charges from the gate of transistor 15. The gate oxide of the transistor 12 is made about 10,000 Angstroms thick, much thicker than the normal gate oxide which is several hundred to a thousand Angstroms thick. Thus, the threshold voltage of transistor 12 is raised above the threshold voltages of the MOS transistors in the integrated circuit proper.

These arrangements work to protect the gate of the transistor 15. However, it has been discovered that when errant static charges pass through the metal pad 10, oftentimes a short circuit occurs at the contact 20 which is the boundary region between the metal line 21 and a conducting region 13. Then, the entire input circuit is effectively incapacitated as if the gate of transistor 15 had been burned out.

FIG. 2A shows a top view of this problem area. The metal layer 21, connected to and physically part of the contact pad 10, leads to the conducting region 13, shown here as a heavily doped N+ region in a P-type substrate 24 forming a P-N junction therebetween. The contact 20 is the interface between the metal 21 and the region 13. This contact is a metal-semiconductor alloy, such as aluminum silicide, when the metal bonded to the semiconductor material. FIG. 2B shows a cross-sectional view of FIG. 2A along section line 2B. In this view, an insulating layer 23, generally silicon dioxide for a silicon substrate, covers the substrate 24 and the conducting region 13, except at the contact 20.

Figure 2C:
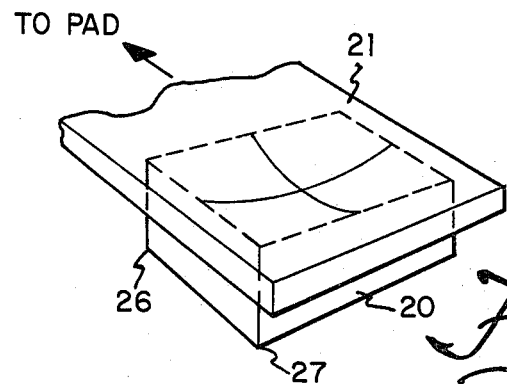

FIG. 2C is an isolated perspective view of the metal layer 21 and the contact 20. This view clearly shows sharp corners or edges 26 and 27 of the contact 20. Only two are numbered for succinctness but it is understood that four edges exist. What is found is that these sharp corners tend to accumulate more charges than the rest of contact 20 and the current density through the contact 20 becomes uneven with the corners 26, 27 bearing the higher current densities upon the discharge of accumulated static charges. These local higher current densities generate more heat and the temperatures at the sharp corners become higher than the rest of the contact 20. Oftentimes these temperatures surpass the eutectic point of the metal-semiconductor and a metal-semiconductor alloy protrusion or spike is created at these corners. If the spike is big enough to reach the P-N junction boundary between the conducting region 13 and the substrate 24, the input circuit is incapacitated because the spike is a short circuit to the substrate 24. Such an incapacitating spike 28 is shown by a dotted line 52 in FIG. 2B.

Figure 3A:
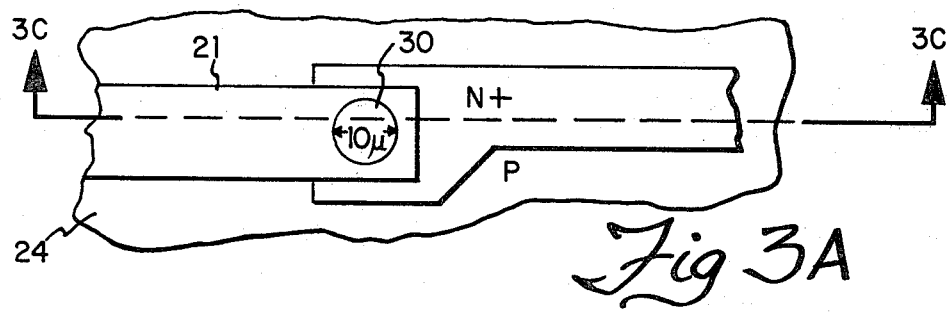
FIGS. 3A and 3B illustrate embodiments of the present invention by a top view.

The present invention solves this problem by significantly rounding the edges or corners of the contact. Charge accumulation on specific regions of the contact and localized high current densities are avoided, wherein the tendency of spike formation is reduced. The edges of the contact are rounded to a much greater extent than that which may occur through the impreciseness of present-day semiconductor processing. FIG. 3A illustrates an embodiment of the present invention. A circular contact 30 is used instead of the square or rectangular contact 20 of FIG. 2A. Note that a polygonal shape, such as an octagon, could be used in place of a circle since a polygon has the effect of significant by rounding the edges by greatly lessening the acuteness of the angles.

The input contact 30 is made larger than the standard contacts of the integrated circuit proper which are square in shape and typically 3.5 to 5 microns on a side. By making the circular contact 30 larger than 5 microns across, the cross-sectional area of the contact is enlarged. The overall current density from the pad 10 into the conducting region 13 is thereby lowered, which helps prevent high temperatures and spiking. Optimally, it is found that the contact 30 should be approximately 10 microns across.

Figure 3B:
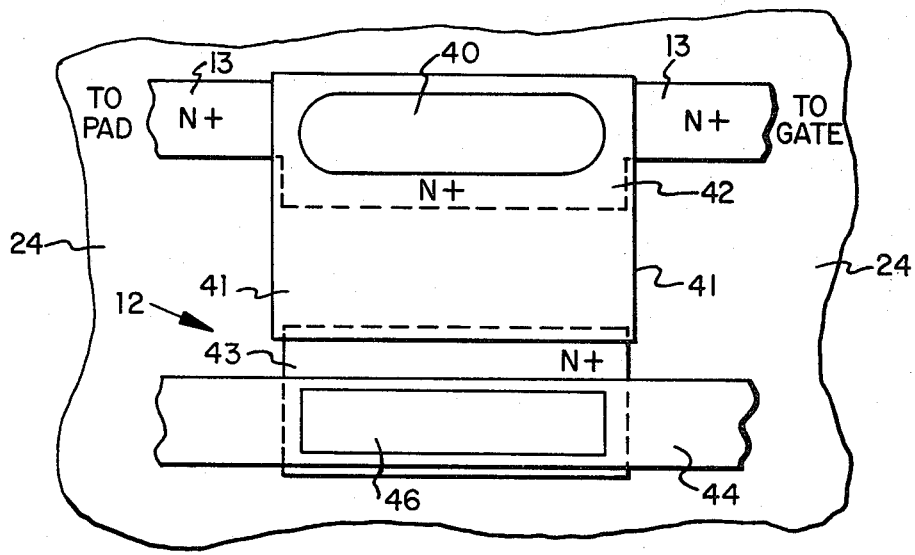

FIG. 3B shows the top view of the input protection MOS transistor 12 according to the present invention. The transistor 12 is laid out in accordance with the circuit in FIG. 1B. A drain region 42 forms part of the conducting region 13 and a source region 43 is connected to a ground line 44 through a contact 46. A metal gate 41 lies over the channel region between the drain region 42 and the source region 43 and is connected to the conducting region 13 through a contact 40. A ground line 44 and the gate 41 lie over the substrate 24 and are separated from the surface of the substrate by an insulation layer (not shown) except at contacts 46 and 40, respectively.

The contact 40 is rounded in accordance with the present invention. The prior art contact 46 is left with its sharp edges for illustrating its difference to the new contact 40. The rounded contact 40 is useful in avoiding any injurious discharge between the metal gate and the conducting region 13. However, the use of rounded contact 40 becomes much more imperative for the circuit in FIG. 1A. In that case the transistor 12 bears the brunt of any errant static charges from the pad 10 rather than having the cushioning effect of the resistor-diode 11 as in FIG. 1B. The circuit in FIG. 1A can be realized by having the metal contact pad physically connected to the gate 41 so that the rounded contact 40 serves both as the contact for the pad 10 to the conducting region 13 and as the gate-to-drain contact for MOS transistor 12.

Figure 3C:
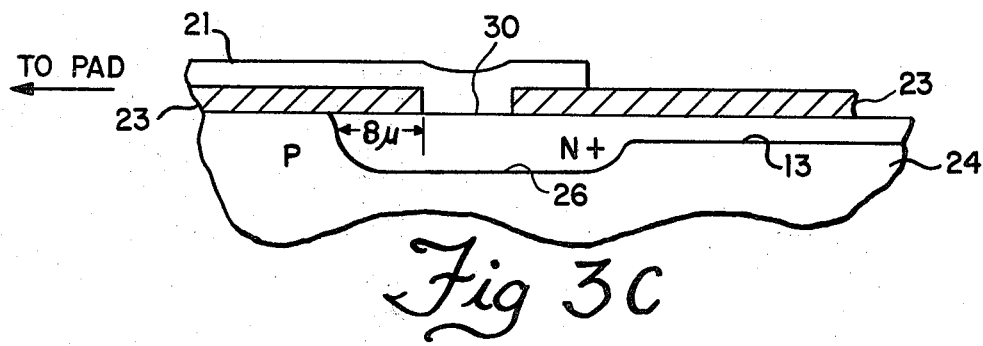
FIGS. 3C and 3D show a side and perspective view of an embodiment of the present invention respectively.
Figure 3D:
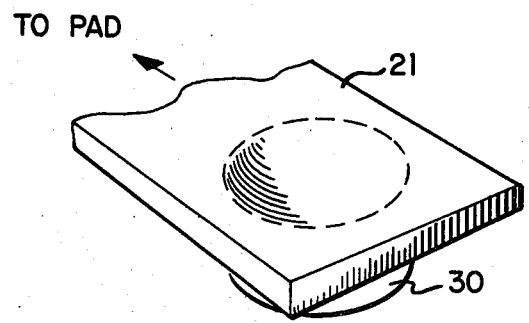

Another aspect of the present invention is contrasted in FIGS. 2B and 3C. In the illustration of the prior art of FIG. 2B, it can be seen that the depth of the region 13 in the substrate 24 immediately beneath and in contact with the contact 20 is shallow. This region 13, which is formed by a diffusion step simultaneously with other conducting regions of an integrated circuit along which electric signals pass, cannot be deep. Additional capacitances are created by the increased area of the P-N junction of the deeper conducting regions. The deeper junction depths also increase side diffusion which degrades the original tight geometrical tolerances of the integrated circuit. These additional junction capacitances and increased side diffusion adversely affect the electrical characteristics of the integrated circuit, such as increasing the overall response time and lowering the punch-through voltages of the MOS transistors and of adjacent diffused conduction regions in the integrated circuit. In the present invention shown in FIG. 3C the junction depth below the contact 30 is set further below by an additional diffusion step, for example, than that for the rest of the conducting region 13. This deeper region 26 of the conducting region 13 lessens the danger of the metal silicide spike breaking through the P-N junction into the substrate. The region below the contact 40 of FIG. 3B can also be treated in the same manner to lessen the chance of injurious discharge in this region. Since the depth of the rest of the conducting region 13 remains shallow, along with the other conducting regions in the integrated circuit, the original functional performance of a circuit is unaffected to any significant extent.

Furthermore, it is observed that these spikes can also travel laterally. If the P-N junction as it approaches the surface of the substrate is set eight microns or more away from the sides of the metal contact, the possibility of lateral spiking into the substrate is substantially reduced. FIG. 3C shows, for the prevention of short-circuiting lateral spikes, the edge of the conducting region 13 spaced laterally at least eight microns away from the contact 30.

Note that while the embodiments described above have N-type conducting regions in a P-type substrate, the invention works equally well with the polarities reversed. Nor is the invention necessarily limited to MOS technology, for other technologies (such as bipolar) having low capacitance inputs to their integrated circuit devices, suffer the same problems as described above. These problems are solved by the present invention. Accordingly, while the invention has been particularly shown and described with reference to a preferred embodiment, it will be understood by those skilled in the art that the foregoing and other changes in form and details may be made therein without departing from the spirit of the invention. It is therefore intended that an exclusive right be granted to the invention as limited only by the metes and bounds of the appended claims.

What is claimed is:

1. An input protection device for an integrated circuit on a semiconductor substrate of a first conductivity type comprising at least one metal pad on said substrate for forming external electrical connection, said metal pad being connected to a conducting region of a second conductivity type in said substrate by a metal-semiconductor alloy contact, said contact having significantly rounded edges whereby the tendency to form higher local currents through specific areas of said contact than through the other areas of said contact is reduced to prevent the formation of a metal-semiconductor alloy protrusion from said contact into said substrate upon a discharge of undesired electric charges.

2. The input protection device as in claim 1 wherein the integrated circuit comprises MOS transistors.

3. The input protection device as in claim 1 wherein said contact is substantially a circle.

4. The input protection device as in claim 1 wherein said contact is substantially a polygon.

5. The input protection device as in claim 4 wherein said contact is at least five microns across.

6. The input protection device as described in claim 1 wherein a first part of said conducting region below said contact is deeper in said substrate than a second part of said conducting region not below said contact.

7. The input protection device as in claim 6 wherein the edge of said conducting region extends laterally at least eight microns away from said contact.

8. An improved input protection device for an MOS integrated circuit on a semiconductor substrate of a first conductivity type having
    a metal pad on said substrate for forming external electrical connections,
    a first conducting region of a second conductivity type in said substrate, forming a P-N junction therebetween, said region at one end connected to said pad by a metal-semiconductor alloy contact and at the other end connected to the rest of said integrated circuit,
    a second conducting region of the second conductivity type in said substrate in close proximity to said first region between said one end and said other end of said first region, a gate over the substrate where said second region is in close proximity to said first region to form an input protection MOS transistor,
    the improvement comprising said contact having significantly rounded edges and the depth of said P-N junction at said one end greater than at said other end so as to reduce the tendency to form higher local current densities through specific areas of said contact than through other areas of said contact and to prevent the formation of a metal-semiconductor alloy protrusion from said contact into said substrate upon a discharge of undesired electric charges.

9. The input protection device as in claim 8 wherein said P-N junction is laterally spaced at least eight microns away from said contact so as to prevent the formation of a metal-semiconductor protrusion laterally from said contact into said substrate upon discharge of said charges.

10. The input protection device as in claim 8 wherein the gate of said input protection MOS transistor is metal and has a second metal-semiconductor alloy contact with said first conducting region, said second contact having rounded edges to reduce the tendency to form higher local current densities through specific areas of said second contact through other areas of said second contact.

11. The input protection device as in claim 10 wherein the depth of said P-N junction below said second contact is greater than the depth of said junction at said other end.

12. The input protection device as in claim 11 wherein said substrate is P-type conductivity silicon, and said first and second region are N-type conductivity silicon.

* * * * *